United States Patent [19]
Li

[11] Patent Number: 6,044,487
[45] Date of Patent: Mar. 28, 2000

[54] MAJORITY VOTING SCHEME FOR HARD ERROR SITES

[75] Inventor: Robert Y. Li, Fremont, Calif.

[73] Assignee: International Business Machines Corporation, Armonk, N.Y.

[21] Appl. No.: 08/991,431

[22] Filed: Dec. 16, 1997

[51] Int. Cl.[7] .................................................. G06F 11/08
[52] U.S. Cl. ............................................ 714/797; 714/5
[58] Field of Search ................................ 714/797, 763, 714/764, 12, 5, 53, 54, 56; 326/35

[56] References Cited

U.S. PATENT DOCUMENTS

| | | | |
|---|---|---|---|
| 4,794,601 | 12/1988 | Kikuchi .................................... | 714/797 |
| 4,993,029 | 2/1991 | Galbraith et al. ....................... | 714/702 |
| 5,084,878 | 1/1992 | Kanekawa et al. ..................... | 714/797 |
| 5,321,703 | 6/1994 | Weng ...................................... | 714/761 |
| 5,349,611 | 9/1994 | Varian .................................... | 375/367 |
| 5,553,231 | 9/1996 | Papenberg et al. .................... | 714/5 |
| 5,588,012 | 12/1996 | Oizumi .................................... | 714/781 |
| 5,903,717 | 5/1999 | Wardrop ................................. | 714/5 |

OTHER PUBLICATIONS

IBM Technical Disclosure Bulletin, vol. 18, No. 6, Armonk, NY, J.S.A., pp. 1987–1988, "Pseudo–Random Recording Channel" (Nov. 1975).

*Primary Examiner*—Hoa T. Nguyen
*Assistant Examiner*—Shelly A Chase
*Attorney, Agent, or Firm*—Altera Law Group, LLC

[57] ABSTRACT

A data recovery scheme is disclosed wherein a majority voting scheme arrives at the correct data and resolves ties with a minimum number of reads. The method includes reading at least one instance of data including a first set of ECC checkbytes from a media, each instance of data and ECC checkbytes comprising a string of bits, forming a voting data string from a majority value for each bit position in the string of bits, generating a second set of ECC checkbytes using the voted data string and returning the voted data sting to a host if the second set of ECC checkbytes is equal to the first set of ECC checkbytes.

18 Claims, 4 Drawing Sheets

MAJORITY VOTING SCHEME FOR HARD ERROR SITES

BACKGROUND OF THE INVENTION

1. Field of the Invention.

This invention relates in general to a data recovery, and more particularly to a majority voting scheme that can arrive at the correct data and resolve ties with a minimum number of reads.

2. Description of Related Art.

There has been a tendency, in digital data systems, to demand a transfer of large amounts of data at high speed. However, it is a common problem in digital data systems for important data to become corrupted by data errors. Data stored on a data storage device, for example, is subject to errors as a result of surface defects or of imperfect tracking between the recording head and a "track" containing the data. Similarly, data that is transmitted from a sender to a receiver on a network may become corrupted by noise. While digital data systems are designed to eliminate sources of errors and to reduce their effects, nevertheless data errors still occur. It is desirable to be able to recover data despite the presence of data errors.

In order to enhance data integrity in digital data systems, such systems commonly employ error correction coding techniques. The use of such techniques enables digital data systems to recover data correctly despite the presence of errors. Using error correction coding, a data system encodes a piece of data into a codeword which typically consists of the original piece of data and some check data. The check data is generated from the original data according to an error-correcting code (ECC). The decoder for the ECC is capable of decoding the codeword to obtain the original data even if some of the data or check symbols are in error. The decoder can distinguish codewords despite errors because the codewords generated by the ECC are sufficiently different from each other.

In magnetic or any other digital recordings, the written data is usually read back as a string of binary bits (alphabets). To ensure data integrity, the user data is usually stored along with ECC (e.g. Reed Solomon) checkbytes. If the read back of the stored data generates a zero ECC syndrome, the data is accepted as correct. In some situations, the ECC syndromes can not be made to be zero and the read back is considered un-recoverable. For an example of an ECC decoder capable of on-the-fly detection of multiple errors and correction of one error per interleave, see commonly owned U.S. Pat. No. 5,329,535, herein incorporated by reference.

The usual digital recording system read back of the stored data can be considered as a special case of the Generalized Majority Voting Data Recovery scheme (GMVDR) where the number of reads is one. In general a GMVDR consists of N-Reads where N can be any positive integer greater than or equal to one. The N-pass majority voting scheme performs N reads of a particular data sector(s) to form an N×C accumulation matrix, where C represents, for example, the number of nibbles (or bits). For each column of the matrix, the nibble with the majority forms the output of the majority voting device.

However, N-pass majority voting schemes generally perform all N reads, where N was an odd number greater than or equal to one, to arrive at the correct data and to ensure that there were no ties. Even if the correct data was arrived at after M times, where M is less than N, N-pass majority voting schemes perform all N reads. Thus, all reads in excess of the number of reads necessary to resolve the correct data were superfluous.

It can be seen then that there is a need for a majority voting scheme that can arrive at the correct data and resolve ties with a minimum number of reads.

SUMMARY OF THE INVENTION

To overcome the limitations in the prior art described above, and to overcome other limitations that will become apparent upon reading and understanding the present specification, the present invention discloses a data recovery scheme.

The present invention solves the above-described problems by providing a majority voting scheme that can arrive at the correct data and resolve ties with a minimum number of reads.

A method in accordance with the principles of the present invention includes a method of error recovery when retrieving data in a data storage system, the system storing data with ECC checkbytes generated from the data, comprising the steps of reading at least one instance of data including ECC checkbytes from a media, each instance of data and ECC checkbytes comprising a string of bits, forming a voted data string and voted ECC checkbytes from a majority value for each bit position in the string of bits, generating a second set of ECC checkbytes using the voted data string and returning the voted data sting to a host if the second set of ECC checkbytes is equal to the voted ECC checkbytes.

Other embodiments of a majority voting scheme in accordance with the principles of the invention may include alternative or optional additional aspects. One such aspect of the present invention is that the step of reading data further comprising the steps of setting a pass value representing the number of times data is read to a value of zero and incrementing the pass value by one each time data is read.

Another aspect of the present invention is that the step of reading at least one instance of data further comprising the steps of setting a pass value representing the number of times data is read to a value of zero and incrementing the pass value by one each time data is read.

Another aspect of the present invention is that the step of returning the voted data sting further comprises the step of comparing the pass value to a limit if the second set of ECC checkbytes is not equal to the first set of ECC checkbytes, the limit representing a maximum number of reads.

Another aspect of the present invention is that the step of comparing the pass value further comprises the step of returning to the step of reading at least one instance of data if the pass value is not greater than the limit.

Another aspect of the present invention is that the step of comparing the pass value further comprises the step of indicating that the data was not retrieved if the pass value is less than or equal to the limit.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a majority voting scheme that can arrive at the correct data and resolve ties with a minimum number of reads.

Figure 1:
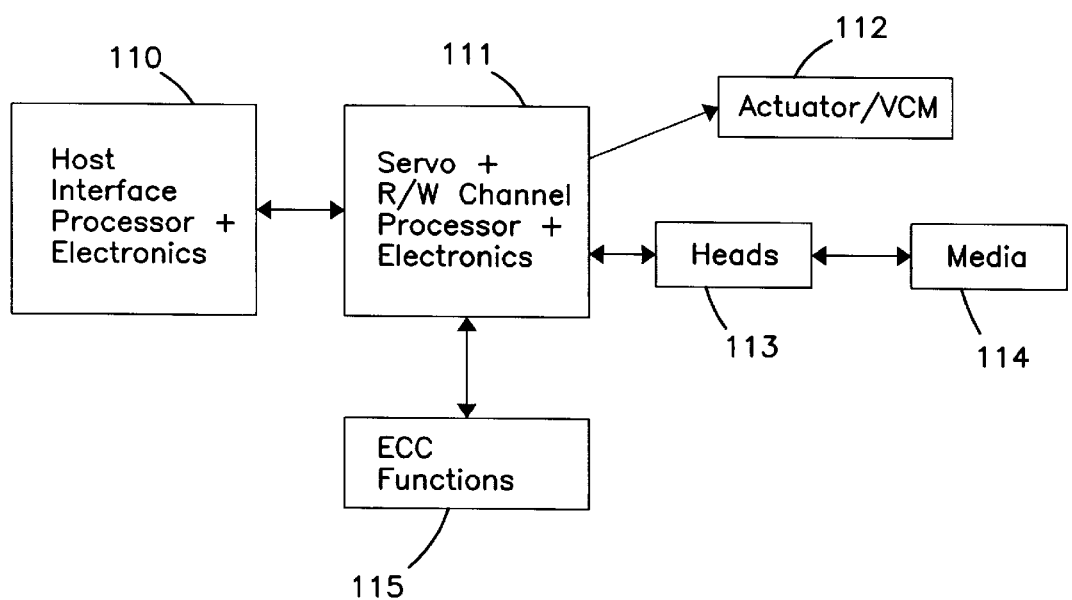
FIG. 1 illustrates a data storage system in accordance with the present invention.

FIG. 1 illustrates a conventional data storage system (disk drive) in which the invention can be practiced. A host interface processor and electronics 110 accepts commands and data from a host and returns data status information to the host. The back-end processes are controlled by the servo and R/W channel processor and electronics 111 which control the VCM/actuator 112 and send and receive signals from the heads 113. The heads read from and write to the magnetic media 114. The ECC functions 115 which generate check symbols and syndromes are integral to the back-end process. The system is shown generically, since the invention can apply to a range of storage systems including tape and disk drives.

The invention relates to the functioning of the drive electronics in such a system. The invention applies equally in systems with single or multiple processors and regardless of how the functions are divided into subunits. The block diagram of a tape system in which the invention could be used is essentially the same as shown in FIG. 1 with exceptions that are irrelevant to the use of the invention, such as that the actuatorVCM component is replaced by the tape transport system.

Data being transferred to or from the media is subject to errors for many reasons. For example, there may be defects at locations on the storage medium used within the storage device that prevent the storage device from reliably storing data at those locations. These defects typically induce "hard" errors, which are errors that persist on every re-read of the defective location. There are also "soft" errors, which tend not to persist. Soft errors have many possible sources, including normal tracking inaccuracies between the recording/playback head and the track of data on the surface of the storage medium.

To reliably store data in spite of such errors, the system employs an error correction scheme when storing and retrieving data from the media. The system encodes the data provided by the host in accordance with an error-correction code (ECC), and stores the resulting encoded data sector on the media. The error correction code has the property that the original data sector can be recovered from the encoded data sector even if the encoded data sector contains some errors.

The type of ECC employed by the data storage system of FIG. 1 is determined by several factors, which are unrelated to the present invention. Among these factors are the amount of storage area required for the encoded data, the code's error-correction power, and the complexity of the corresponding decoder. The present invention can be practiced with any type of block code for which suitable decoders can be made. A commonly-used type of code in data storage systems is the class of Reed-Solomon codes, which are special forms of BCH codes.

When the system reads and decodes the data sector from the media, all erroneous symbols in the data sector are corrected as long as the number of symbol errors does not exceed an error limit. This error limit is determined by the type of ECC used. For Reed-Solomon codes, the error limit is ½ (number of redundant symbols-1). Thus, for example, a code that adds 67 redundant symbols to the data symbols to form a codeword can correct up to 33 errors. In the process of decoding, the system determines whether the error limit has been exceeded. If the error limit has been exceeded, then the decoded data contains errors. In most instances, erroneous data cannot be given to the host. If the error limit has not been exceeded, then the original data sector has been decoded from the encoded read result data sector correctly, and can be passed on to the host.

The system performs multiple read trials until either a trial yields a data sector having fewer errors than the code's error limit, or the number of trials has reached a trial limit. The trial limit is a design parameter in the system. A high trial limit results in more successful data recovery, while increasing the worst-case data access time; a lower trial limit of course does the opposite. The trial limit might be set to 2 in a relatively error-free system; it would be higher in a more error-prone system. Each attempt to read the data may result in different instances of data which are not equal to one another.

The trial method discussed above is effective when at least some of the errors in the data sector are soft errors, so that the number of erroneous symbols in at least one of the trials will be less than the error limit. If the soft error rate is low, one of the trials is likely to be successful by itself in obtaining the original data. However, when the soft error rate is higher, or when the combination of hard and soft errors pushes the total number of errors over the error limit, the likelihood of successful decoding in a series of trials diminishes. In order to obtain the original data sector despite the failure of several trials, the system implements additional functions as illustrated and described with reference to FIGS. 2 and 3 below.

Figure 2:
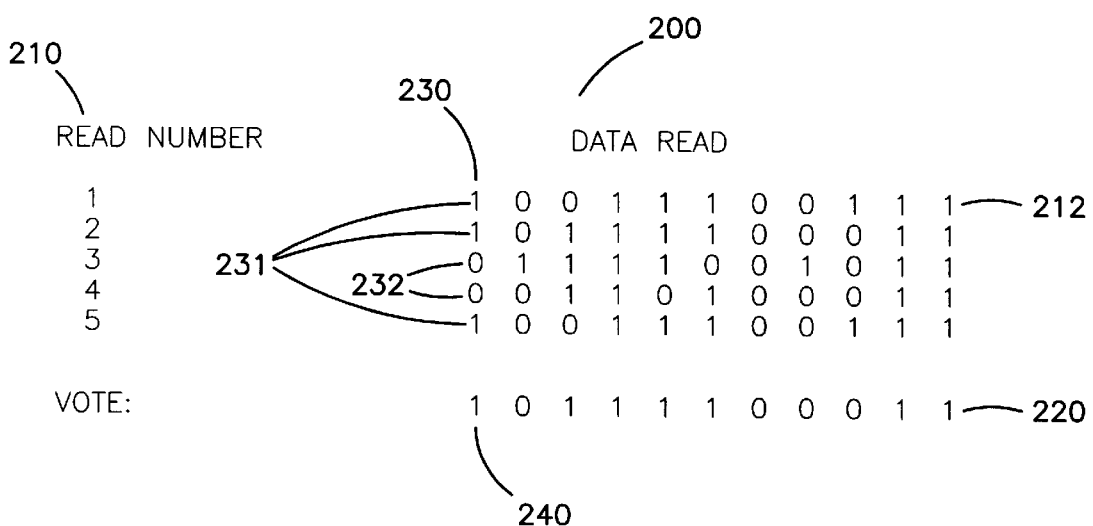
FIG. 2 illustrates a matrix for a N-pass majority voting scheme according to the present invention.

FIG. 2 illustrates a matrix 200 for a N-pass majority voting scheme, wherein N is equal to five. In FIG. 2, a read count column 210 indicates the number for each read. For each read, a string of eleven binary data bits 212 are ascertained. At the end of five reads, the majority voting scheme determines a voted data bit string 220 for the stored data. For example, in a first bit column 230 for the string of eleven binary data bits, three "one" bits 231 and two "zero" bits 232 were read. Thus, the majority voting scheme assigns a "one" value for the first bit value 240. This process is repeated for each of the columns. The ECC checkbytes are included in the voting process since the read errors may affect the ECC checkbytes also.

Figure 3:
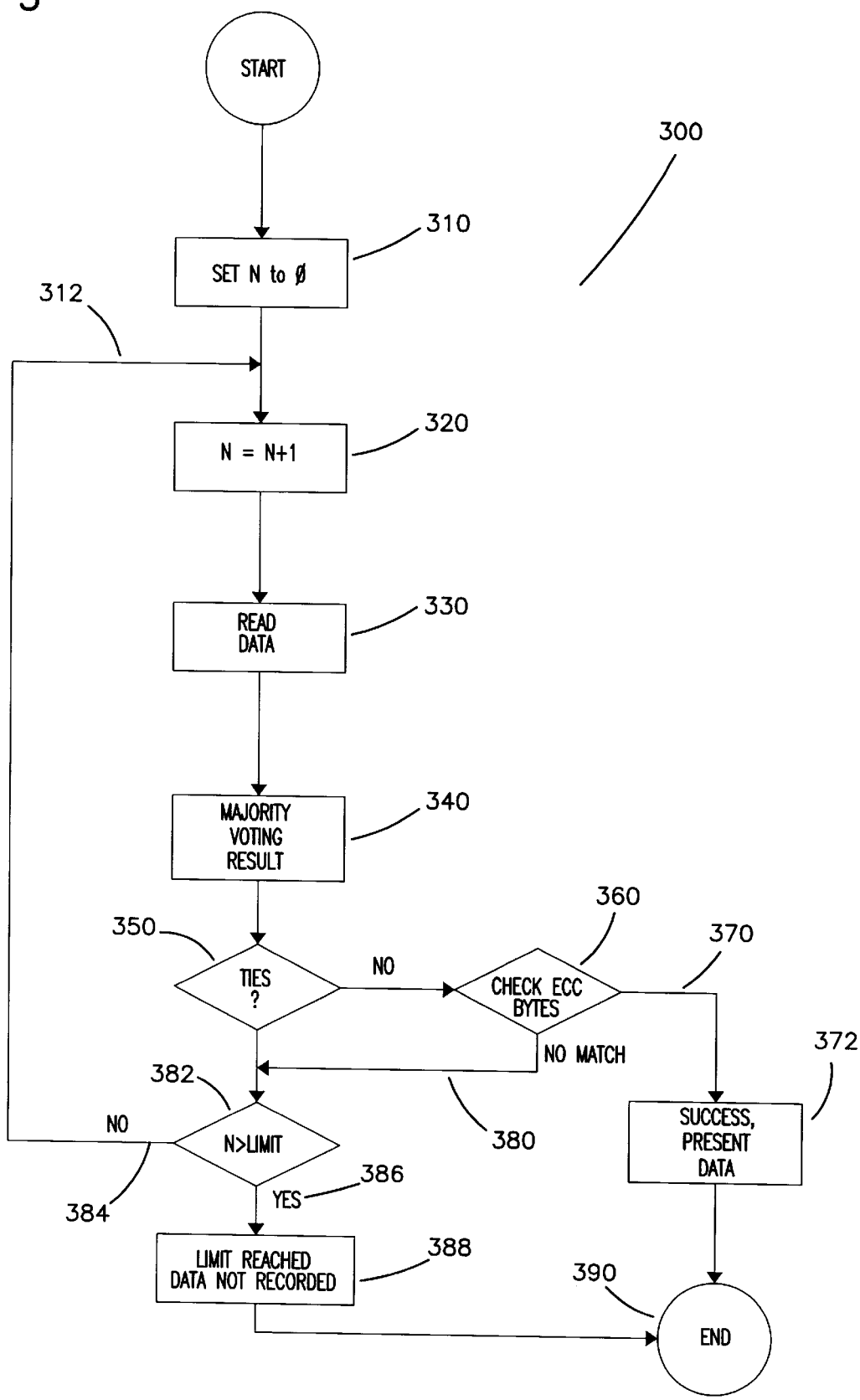
FIG. 3 illustrates a flow chart for the majority voting scheme on a hard error site according to the present invention.

FIG. 3 illustrates a flow chart 300 for the majority voting scheme on a hard error site. In FIG. 3, N is initially set to zero 310. Each pass through the majority voting loop 312, N is incremented by one 320 and then the data, including ECC checkbytes, is read 330. After the data has been read it is written to a storage location and a majority voting process 340 is performed to arrive at a voted data string. Then a determination is made as to whether there are any ties 350.

If there are no ties, the voted data string is checked for a valid data ECC checkbyte match 360. To check the voted data string for a valid data match, the voted data string is analyzed to determine if the voted data string generates a zero ECC syndrome by comparing the voted ECC checkbytes to system generated ECC checkbytes using the voted data string. The ECC checkbytes are normally generated by the hardware circuitry when data is written to the media. In order to generate the checkbytes for voted data, the checkbyte generation function should be made available to the error recovery function. The error recovery function will store the voted data in a buffer. If the checkbyte generator was designed to accept a buffer address (and optionally a count) and then to place the calculated checkbytes in the buffer following the data, the error recovery function could use the same generator as the write function. Alternatively, the circuitry could be duplicated in the error recovery function or the checkbytes could be calculated by the system firmware. The voting scheme of the invention does not require that the ECC algorithm be changed in anyway, so the checkbytes can be calculated using prior art methods.

If the voted data string ECC checkbytes match the generated ECC checkbytes 370, the data is accepted as correct 372. If the ECC checkbytes do not match 380, the value of N is compared against a pass limit 382. If the limit is not exceeded 384, then the majority voting loop 312 is repeated. If the pass limit is exceeded 386, then the data is deemed to have not been retrieved 388 and the process terminates 390. Since data reads are processed by a majority voting scheme which is then checked for a valid data ECC checkbyte match, the majority voting scheme of the invention can arrive at the correct data and resolve ties with a minimum number of reads.

Figure 4:
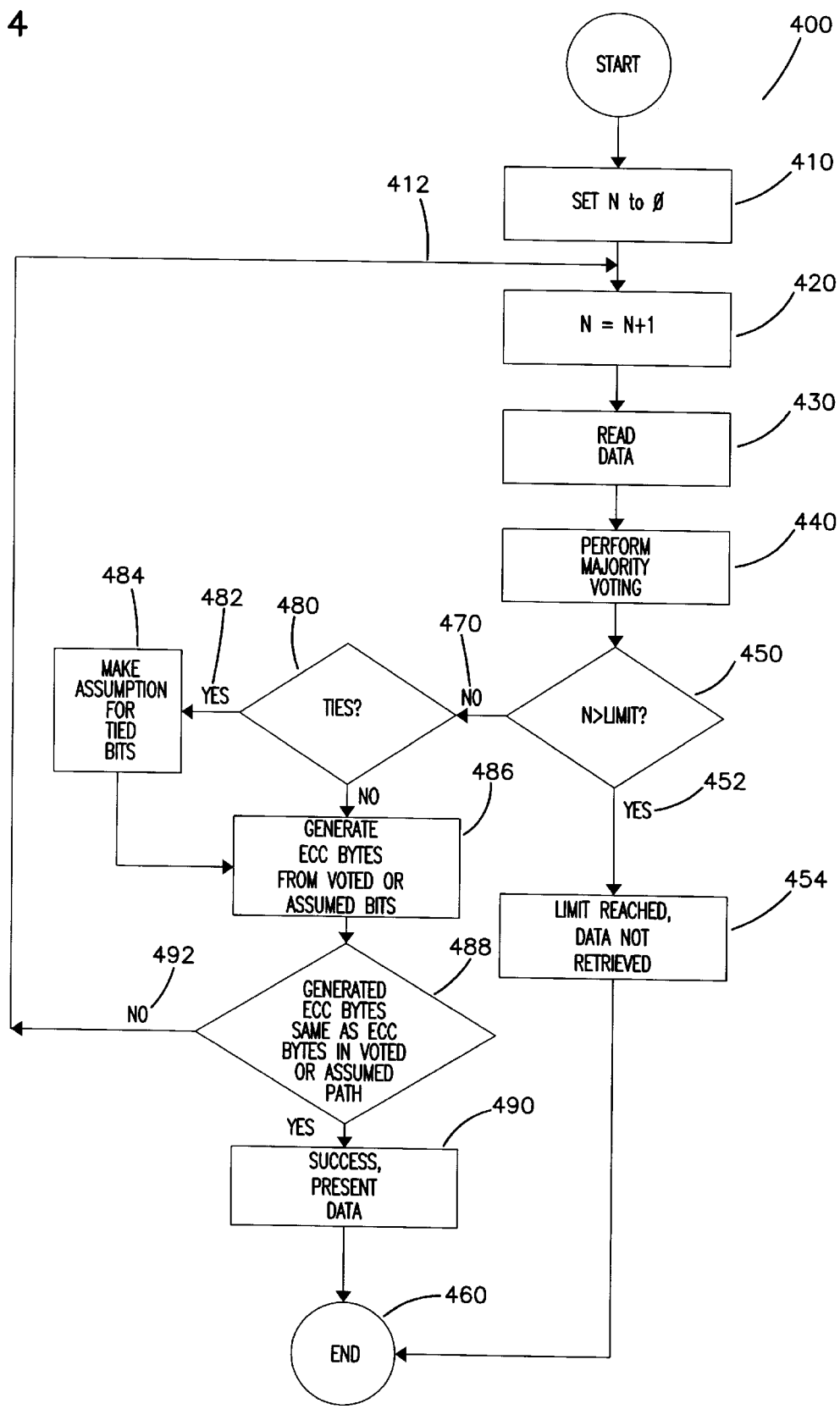
FIG. 4 illustrates a flow chart for an alternative embodiment of the present invention

FIG. 4 illustrates a flow chart for an alternative embodiment of the present invention. In FIG. 4, N is initially set to zero 410. Each pass through the majority voting loop 412, N is incremented by one 420 and then the data is read 430. After the data has been read it is written to a storage location and a majority voting process 440 is performed to arrive at a voted data string. Then a determination is made as to whether the value of N exceeds a pass limit 450. If the limit is exceeded 452, the data is deemed to not be retrieved 454 and the process terminates 460. If the limit is not exceeded 470, then a determination is made as to whether there are any ties 480.

If there are ties 482, an assumption is made regarding tied bits 484. Then ECC checkbytes are generated from the voted or assumed data 486. Next, a determination is made as to whether the generated ECC bytes are the same as the ECC checkbytes in the voted or assumed data 488. If a match occurs, the data is accepted as correct 490. If not 492, the process loops around again 412 and N is incremented 420.

It should be noted that some systems' schemes store data differently for adjacent tracks or sectors or even bytes. For example, in U.S. Pat. No. 4,993,029, a data and ECC checkbyte randomization scheme is described. The result of such a scheme is that otherwise identical data blocks will be stored using completely different bits for the data and checkbytes depending on where they are stored. In order to generate checkbytes for voted data according to the invention, the randomization function must be bypassed.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of error recovery when retrieving data in a data storage system, the system storing data with ECC checkbytes generated from the data, comprising the steps of:

reading at least one instance of data including ECC checkbytes from a media, each instance of data and ECC checkbytes comprising a string of bits;

forming a voted data string and voted ECC checkbytes from a majority value for each bit position in the string of bits;

generating a second set of ECC checkbytes using the voted data string; and returning the voted data string to a host if the second set of ECC checkbytes is equal to the voted ECC checkbytes.

2. The method of claim 1 wherein the step of reading at least one instance of data further comprising the steps of setting a pass value representing the number of times data is read to a value of zero and incrementing the pass value by one each time data is read.

3. The method of claim 2 wherein the step of returning the voted data string further comprises the step of comparing the pass value to a limit if the second set of ECC checkbytes is not equal to the first set of ECC checkbytes, the limit representing a maximum number of reads.

4. The method of claim 3 wherein the step of comparing the pass value further comprises the step of returning to the step of reading at least one instance of data if the pass value is not greater than the limit.

5. The method of claim 3 wherein the step of comparing the pass value further comprises the step of indicating that the data was not retrieved if the pass value is less than or equal to the limit.

6. A method of retrieving data in a digital data system, comprising the steps of:

(a) reading data from a digital data system, the data comprising a string of digital data bits;

(b) deriving a voted data string from the read data using a majority voting process;

(c) checking for a valid data match between a ECC checkbyte calculated from the voted data string and a ECC checkbyte associated with data being read; and (d) accepting the voted data string as correct in response to detecting a valid data match.

7. The method of claim 6 wherein the step of reading data further comprising the steps of setting a pass value representing the number of times data is read to a value of zero and incrementing the pass value by one each time data is read.

8. The method of claim 7 wherein the step of checking for a valid data match further comprises the step of comparing the pass value to a limit if a match does not exist, the limit representing a maximum number of reads.

9. The method of claim 8 wherein the step of comparing the pass value further comprises the step of returning to step (a) if the pass value is not greater than the limit.

10. The method of claim 8 wherein the step of comparing the pass value further comprises the step of indicating that the data was not received if the pass value is less than or equal to the limit.

11. The method of claim 6 wherein the step of deriving a voted data sting further comprises the step of comparing the pass value to a limit if a tie exists, the limit representing a maximum number of reads.

12. The method of claim 11 wherein the step of comparing the pass value further comprises the step of returning to step (a) if the pass value is not greater than the limit.

13. The method of claim 11 wherein the step of comparing the pass value further comprises the step of indicating that the data was not received if the pass value is less than or equal to the limit.

14. A storage system, comprising:

storage media for storing data for later retrieval;

a host interface processor for issuing store and read requests; and a channel processor for accessing the storage media to complete the store and read requests by the host interface processor, the channel processor reading at least one instance of data including ECC checkbytes from the media, each instance of data and ECC checkbytes comprising a string of bits, forming a voted data string and voted ECC checkbytes from a majority value for each bit position in the string of bits, generating a second set of ECC checkbytes using the voted data string and returning the voted data string to a host if the second set of ECC checkbytes is equal to the voted of ECC checkbytes.

15. A method of error recovery when retrieving data in a data storage system, the system storing data with ECC checkbytes generated from the data, comprising the steps of:

reading at least one instance of data including ECC checkbytes from a media, each instance of data and ECC checkbytes comprising a string of bits;

performing voting to create a voted data string and voted ECC checkbytes;

determining whether a tie for bits in the voted data string occurs;

making an assumption for tied bits;

generating a second set of ECC checkbytes from the voted, untied bits and the assumed bits; and returning the voted data string to a host if the second set of ECC checkbytes is equal to the voted ECC checkbytes.

16. The method of claim 15 wherein the step of reading at least one instance of data further comprising the steps of setting a pass value representing the number of times data is read to a value of zero and incrementing the pass value by one each time data is read.

17. The method of claim 16 further comprising the step of comparing the pass value to a limit.

18. The method of claim 17 wherein the step of comparing the pass value further comprises the step of indicating that the data was not retrieved if the pass value is less than or equal to the limit.

* * * * *

UNITED STATES PATENT AND TRADEMARK OFFICE
CERTIFICATE OF CORRECTION

PATENT NO. : 6,044,487
DATED : March 28, 2000
INVENTOR(S) : Li

It is certified that error appears in the above-identified patent and that said Letters Patent is hereby corrected as shown below:

Column 2,
Line 28, replace "sting" with -- string --;
Line 43, replace "sting" with -- string --;

Column 6,
Line 67, replace "sting" with -- string --.

Signed and Sealed this

Fourth Day of June, 2002

Attest:

Attesting Officer

JAMES E. ROGAN
*Director of the United States Patent and Trademark Office*